United States Patent [19]

Kleinschmidt et al.

[11] 4,392,074
[45] Jul. 5, 1983

[54] TRIGGER DEVICE AND PIEZO-IGNITION COUPLER WITH GALVANIC DECOUPLING

[75] Inventors: Peter Kleinschmidt; Valentin Magori, both of Munich, Fed. Rep. of Germany

[73] Assignee: Siemens Aktiengesellschaft, Berlin & Munich, Fed. Rep. of Germany

[21] Appl. No.: 252,298

[22] Filed: Apr. 9, 1981

[30] Foreign Application Priority Data

Sep. 19, 1980 [DE] Fed. Rep. of Germany ....... 3035503
Oct. 28, 1980 [DE] Fed. Rep. of Germany ....... 3040530
Oct. 30, 1980 [DE] Fed. Rep. of Germany ....... 3040916

[51] Int. Cl.³ .................................... H01L 41/08
[52] U.S. Cl. ............................ 310/327; 310/318; 310/319; 310/340; 310/366
[58] Field of Search ................... 310/366–369, 310/318, 319, 358, 359, 326, 327, 348, 351, 353, 340

[56] References Cited

U.S. PATENT DOCUMENTS

| | | | |
|---|---|---|---|
| 2,271,870 | 2/1942 | Mason | 310/366 X |
| 2,277,709 | 3/1942 | McSkimin | 310/366 X |
| 2,943,278 | 6/1960 | Mattiat | 310/366 X |
| 2,969,512 | 1/1961 | Jaffe et al. | 310/366 X |
| 3,432,773 | 3/1969 | Land et al. | 310/358 X |
| 3,899,698 | 8/1975 | Kleinschmidt | 310/9.5 |

FOREIGN PATENT DOCUMENTS

748910 7/1933 France ................... 310/366

OTHER PUBLICATIONS

"A Qualitative Study of the DC Performance of SIPMOS Transistors" by J. Tihanyi, from Siemens Forschungs-und Entwicklungsberichte, vol. 9, No. 4 (1980), pp. 181-189.

"Siemens Components" 18, No. 4 (1980) pp. 187-188.

Primary Examiner—Mark O. Budd
Attorney, Agent, or Firm—Hill, Van Santen, Steadman, Chiara & Simpson

[57] ABSTRACT

A trigger device for electronic switches operating according to piezo-electric principles and having galvanic decoupling between the input control electronics and the controlled electronics switch has a piezo-ignition coupler which is a lamina of piezo-ceramic material having at least two spaced electrodes on one surface thereof and at least two counter electrodes in registry therewith on an opposite side thereof. The respective electrodes in registry form electrode pairs and one pair of electrodes is connected to the control electronics and another pair of electrodes is connected to the trigger electrode of the electronic switch. The lamina has a shape displaying an axis with more than two-fold rotational symmetry and the dimensions of the lamina are selected such that the frequency of an alternating signal supplied to the lamina is matched to the resonant frequency of the lamina at a value between 20 kHz and 500 kHz for inducing a mode of vibration according to the principle of radial oscillation.

22 Claims, 12 Drawing Figures

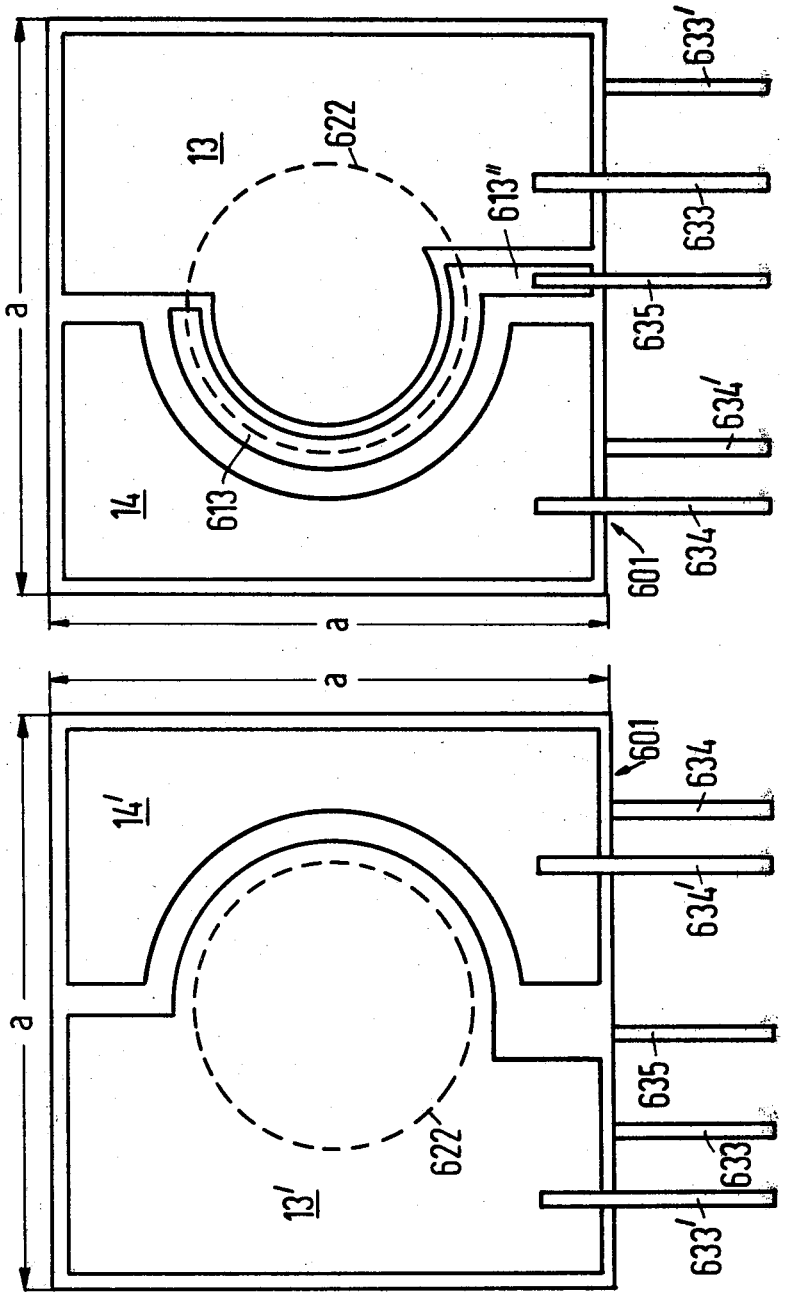

4,392,074

TRIGGER DEVICE AND PIEZO-IGNITION COUPLER WITH GALVANIC DECOUPLING

BACKGROUND OF THE INVENTION

The present invention relates to triggering devices for electronic switches such as thyristers, triacs and MOS power switches.

Triggering devices for operating thyristers and triacs are known which have a structure so as to galvanically decouple the control electronics from the controlled device. One such known device employs a transformer with two windings which are not galvanically connected to one another and which are disposed between a thyrister to be controlled and the control electronics. Another known triggering device employs an opto-electronic coupling element for the same purpose.

The use of a transformer as the decoupling structure as described above requires a capacitor be connected in parallel to that secondary winding of the transformer which is connected to the trigger electrode of the thyrister so that noise signals proceeding from the output side or from the load side of the thyrister do not trigger the thyrister via the anode-to-grid capacitance of the thyrister. If an opto-electronic coupling element is employed, an auxiliary voltage supply must also be provided on the secondary side. The use of a capacitor in the transformer structure or an auxiliary voltage supply in the optoelectronic structure represents an additional circuit outlay and expense associated with those types of devices.

A circuit for galvanically separated drive of a SIP-MOS power switch is known from the publication "Siemens Components", 18, No. 4 (1980), pages 187–188 wherein a transformer having three windings is employed for galvanically separate transmission of the drive signal. An exemplary circuit for such a drive with a transformer is shown in FIG. 1 of the publication. A SIPMOS power switch or power circuit breaker is a semiconductor component which is essentially a field effect transistor manufactured according to known MOS technology such that large currents can be switched by the component. Such power switches may be employed, for example, for switching the operating current of a motor. Further details of such MOS power switches can also be found in "Siemens Forschungsund Entwicklungsberichte," Vol. 9, No. 4 (1980) at pages 181–189.

Galvanically decoupled drive of such MOS power switches is desirable in almost every application where protection is required as a result of the presence of high voltages. A MOS power switch can be reliably switched on and off with six volts, although the voltage to be switched by the power switch can amount to several hundred volts such as, for example, bus line voltage.

A micro-relay or an opto-electronic coupler consisting of a photodiode at the input side and a phototransistor at the output side may be employed for galvanically decoupled drive of a MOS power switch, however, the use of such devices results in additional outlays such as, for example, auxiliary circuits, particularly for current limitation and further necessitates the presence of an additional voltage source on the load side.

A trigger device with a piezo-coupler which does not require such additional circuit outlay is claimed in the co-pending application of Valentin Magori, filed on Apr. 8, 1981 and assigned U.S. Ser. No. 252,080.

SUMMARY OF THE INVENTION

It is an object of the present invention to provide a trigger device for electronic switches having galvanic decoupling which can be realized with a minimum materials and circuit outlay and which does not require auxiliary devices for operation. It is a further object of the present invention to provide such a trigger device which can be operated with a low supply voltage of, for example, 5 volts at the input or primary side permitting matching to microprocessor systems.

Another object of the present invention is to provide a trigger for a MOS power switch having a galvanically separated drive circuit which can be simply constructed.

Another object of the present invention is to provide a trigger device with galvanic decoupling which operates according to the piezo-electric principle and which is excited by a drive frequency which is matched to the natural resonant frequency of the device which operates as a piezo-coupler.

The above object is inventively achieved in a trigger device for electronic switches which consists of a lamina having pairs of electrodes disposed on the opposite sides. Signals are supplied to an input pair of electrodes and an acoustic wave is generated which is transferred as a trigger signal to the device to be triggered by the output pair of terminals. The lamina is of a shape having an axis with more than two-fold rotational symmetry and has dimensions selected such that the natural resonant frequency of the lamina is matched to the signal received from the control circuitry.

As is described in the aforementioned co-pending application Ser. No. 252,080, a signal of sufficient magnitude for triggering, for example, a thyrister can be taken from the output side of a lamina comprised of piezo-ceramic material. This magnitude need only amount to a few volts and the input side of the lamina is excited by means of an applied electrical signal so as to generate a suitable acoustic wave according to the piezoelectric principle which results in a suitable output signal. Because a triggering device having a lamina of this type has an efficiency of approximately 25% between the input and the output, an input power which is only approximately four times as great as is necessary for the triggering signal need by applied. The control electronics which may, for example, be a microprocessor, are connected to the input side and supply such electrical power at a magnitude amounting to only a few volts. It is also possible to undertake a triggering operation utilizing a device as described above by slowly charging the lamina with an electrical voltage and subsequently short circuiting the input side so as to effect a nearly instantaneous change of the charge state at the input side.

The present invention, while employing basic principles of the invention disclosed in co-pending Ser. No. 252,080 is an improvement over the device disclosed therein by permitting excitation of the piezo-ignition coupler with alternating voltage pulses which are clocked to match the resonance of the natural oscillation of the material comprising the coupler.

Such a piezo-coupler can be employed for triggering thyristers, triacs and MOS power switches. The drive signal of the primary side input via the input pair of electrodes is transmitted as an acoustical wave in the area of at least one pair of output electrodes and the signal which occurs at the output electrode pair is supplied to the gate terminal of the MOS power switch for controlling the switch. The piezo-coupler disclosed in the present application can be used to replace, for example, the complicated isolation transformers of the circuit described in the aforementioned publication "Siemens Components." Because the piezo-coupler as disclosed and claimed in the present application functions on the secondary side as a voltage generator, an electrical voltage and corresponding power can be generated by the use of said coupler which is not only galvanically separated from the input control electronics but is also decoupled from any reference potential or ground potential on the secondary side. If, for example, an operating voltage of 12 volts above ground is available, as is the case in conventional automotive electronics, such a gate voltage can be generated simply with the invention piezo-coupler having a negative potential at aproximately 12 volts and a positive potential of up to 18 volts in comparison to the negative potential of the operating voltage. Thus, a MOS power switch can be connected to a load resistor in such a manner that the drain terminal of the power switch is directly connected to the positive pole of the operating voltage and the source terminal is connected to the terminal of the load resistor, whereas the remaining terminal of the resistor is connected to the negative pole at ground. Thus, as is standard in automotive electronics, one pole of the load resistor which may, for example, be the headlight bulb, a windshield washer motor, a blower motor, or a similar load device, can, be connected to the vehicle body lying at the negative pole permitting a semiconductor MOS power switch to be employed. Such a switch is constructed in an n-channel format such as a field effect transistor of the enhancement type.

The various features of the piezo-ignition coupler disclosed herein are matched to one another in such a manner that, with a minimum size of the body of the coupler, a sufficiently large piezo-electric coupling exists between the input and the output so that an electric ignition signal is reliably and quickly produced at the output for triggering a controlled device. Moreover, the dielectric constant of the material comprising the coupler can be minimized. As a result of a small plate thickness of the coupler, the capacitance of the input pair of electrodes is such that a sufficiently large ignition current I results.

According to the piezo-electric principle, the mechanical resonant vibration occurring during operation of the device at a frequency f as a result of the application of an alternating voltage U results in a high ignition current I which is determined at least in part by the mechanical quality factor Q of the piezo-ceramic material comprising the coupler. This quality is most preferable for the present purposes when the body for the coupler is in the form of a plate having a symmetrical shape with an axis with more than two-fold rotational symmetry. Moreover, because of the presence of this axis with more than two-fold rotational symmetry, the shape is completely determined by selection of a single length dimension such as, for example, in case of a square, a regular pentagon, hexagon or any regular polygon up to and including a circular plate. In the embodiment wherein a circular plate is employed, a so-called radial oscillation exists at a resonant frequency which is determined by the diameter of the disc. A piezo-coupler having a shape selected according to these criteria, the closest undesired mode of vibration in terms of frequency is so far from the resonant frequency of the desired (radial) mode of vibration that essentially only this one desired mode of vibration is excited by the input alternating voltage U of the control electronics. This desired mode is, however, excited with full intensity. An excitation frequency and a corresponding resonant frequency in the range of 20 kHz to 500 kHz is preferable because the number of mechanical vibrations per time unit is so great that the precise point in time at which ignition of the controlled device actually occurs is of little or no significance.

An ignition current I generated by a device as described above has a value determined by the equation:

$$I = U \cdot 2 \cdot \pi \cdot f \cdot C \cdot Q \cdot k^2$$

The factor k in the above equation is the coupling factor of the piezo-ceramic material comprising the body of the ignition coupler and the value C is the capacitance of the coupler.

A particularly strong coupling is achieved when the coupler is excited in the fundamental mode of vibration. In order, however, to achieve a sufficiently large capacitance C, a minimum surface area of the plate comprising the coupler is necessary because the thickness of the plate is desired to be maintained as thin as possible. If the calculated minimum surface is so large in a particular case that the corresponding length dimension determining the plate size becomes so large that the fundamental resonant frequency is less than the lower limit of 20 kHz, excitation may be achieved in an nth harmonic, preferably the first harmonic, associated with this type of oscillation which has a frequency which is higher by a known multiple than the associated fundamental frequency. In either mode of operation, fundamental vibration or harmonic vibration, the electrodes of the input and output pairs of electrodes are disposed so as to essentially cover those portions of the plate surface oscillating with maximum amplitude, that is, the antinode, for the selected mode of vibration.

In a further embodiment of the invention the input electronics can be further simplified by use of a feedback effect.

Price considerations for manufacturing a commercially acceptable device of the type described above may be a factor insofar as the tolerance demands for obtaining the required frequency precision and constancy. The necessary precision is somewhat at odds with the manufacture of wide range and large scale employment in terms of numbers of such piezo-couplers. Such precision tolerances can be avoided, however, according to the principles of the present invention by providing self-induced vibratory operation of the piezo-coupler. To that end, a further electrode is applied which is dimensioned and disposed at a selected location on the surface of the lamina for a feedback electrode. The presence of this electrode must, however, not generate an unwanted mode of vibration or a change in the mode of vibration during operation. In order to avoid such a situation, the feedback electrode is strip-shaped and is disposed in the area, if possible, of a nodal line of an unwanted harmonic.

The input electronics for use in the present invention may have one or more CMOS inverters and an additional fixed resistor which need not be manufactured with a precise value. At one input of the inverter, the amplification can be controlled so that no generation of a resonant vibration occurs in the piezo-coupler in a state of minimum amplification. The inverter can, however, be operated so as to provide an amplification of the desired value which guarantees reliable and continued operation at a selected resonant frequency.

DESCRIPTION OF THE DRAWINGS

FIGS. 11a and 11b show opposite sides of a piezo-coupler constructed in accordance with the principles of the present invention with feedback electrodes.

DESCRIPTION OF THE PREFERRED EMBODIMENTS

Figure 1:
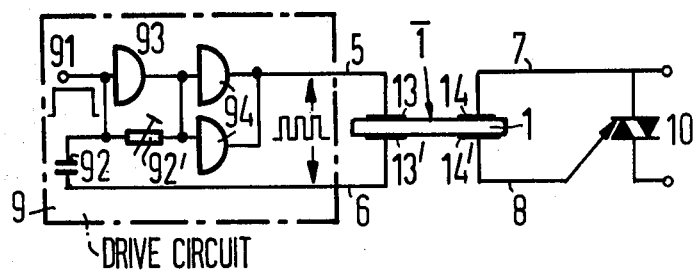
FIG. 1 is a schematic diagram of a trigger device with a piezo-ignition coupler and associated drive circuit constructed in accordance with the principles of the present invention.
Figure 4:
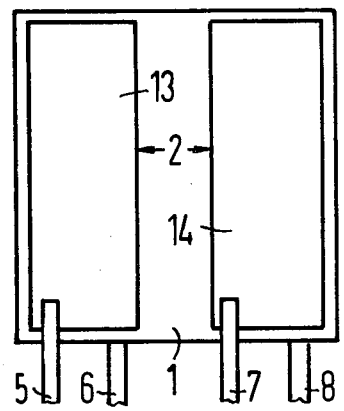
FIGS. 4, 5 and 6 are plan views of further embodiments of the piezo-ignition coupler constructed in accordance with the principles of the present invention.

A basic circuit diagram for a trigger device for electronic switches constructed in accordance with the principles of the present invention having a piezo-ignition coupler $\bar{1}$. The coupler $\bar{1}$ is shown in FIG. 1 to be of a square shape as shown in greater detail in FIG. 4, however, any of the alternate embodiments of the coupler $\bar{1}$ shown in FIGS. 2, 5 and 6, for example, may be employed in the device shown in FIG. 1. The coupler 1 in the square embodiment has a thin lamina body 1 having electrodes 13 and 14 on one side thereof and counterelectrodes 13' and 14' in registry therewith on an opposite side thereof. The electrodes 13 and 13' form an input pair which are respectively connected to a drive circuit 9 by terminals 5 and 6. The electrodes 14 and 14' form an output pair for the coupler $\bar{1}$ and are connected to a controlled device by respective terminals 7 and 8. In the circuit shown in FIG. 1, the controlled device is a triac 10, however, it will be understood that the inventive concept disclosed herein can be employed to control any switching device such as a triac, a thyrister, or an MOS power switch. As shown in FIG. 4, the electrodes 13 and 14, as well as the electrodes 13' and 14' on the opposite side, are separated by a gap or spacing 2 which provides sufficient galvanic decoupling between the electrodes on a same side of the lamina 1 to meet VDE regulations, or the regulations of other countries.

The pairs of electrodes 13 and 13', and 14 and 14' form two capacitances between whose electrodes a mechanical oscillation or acoustical wave is generated by the application of an alternating voltage across the terminals 5 and 6. An electrical output voltage is tapped on the terminals 7 and 8 generated as a result of such excitation. The lamina 1 is comprised of piezo-ceramic material and the distribution of the magnitude of the piezo-electric effect takes the form of radial oscillation having a maximum for the fundamental oscillation in the center of the lamina 1, known as the antinode, and may have a maximum for the first harmonic also at the center of the lamina 1 with further maxima symmetrically and concentrically distributed along nodal lines. As described below, the terminals which serve for electrical connection as well as mechanical support are attached in such a manner as to exert minimum influence on the piezo-electric oscillation of the lamina 1 so that the distribution of maxima on the lamina 1 is essentially that which would result from uninhibited resonant oscillation. It will be understood that although the term "radial oscillation" is employed, this term is not restricted to only the circular embodiment of the coupler shown in FIGS. 2 and 5, but applies to all shapes of the coupler.

The drive circuit 9, upon the application of a pulse to the control input 91, generates a correspondingly clocked output signal to the input pair of electrodes 13 and 13'. The output signal from the drive circuit 9 is an alternating voltage signal with a frequency which is determined by the dimensions of the lamina 1 and is between 20 kHz and 500 kHz. The frequency of the alternating voltage supplied by the drive circuit 9 and the resonant frequency of the lamina 1 coincide.

Figure 2:
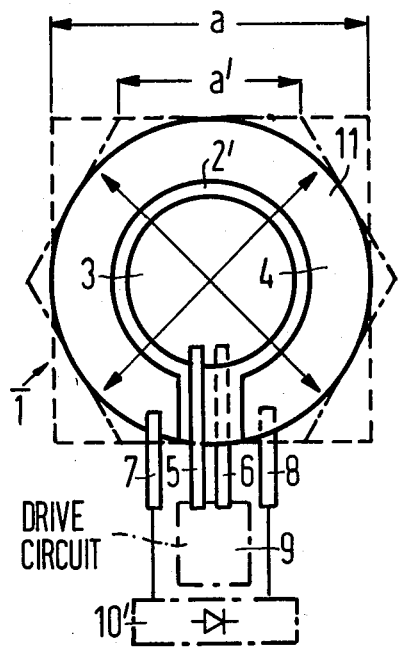
FIG. 2 is a plan view with an associated circuit schematic of the piezo-ignition coupler of the type employed in FIG. 1 showing different shape variations.

A further embodiment of the coupler $\bar{1}$ is shown in FIG. 2 which consists of a disc 11 comprised of piezo-electric ceramic which may, for example, have a diameter of 20 mm and a thickness in the range of 0.1 through 0.2 mm. The piezo-electric ceramic may, for example, be a material known to those skilled in the art such as lead zirconate titanate or barium titanate. The piezo-electric ceramic is fabricated into a body of the desired shape by means of sintering as is known to those skilled in the art. The disc 11 has a central circular electrode 3 and a surrounding annular electrode 4 concentrically disposed and separated by a gap 2' which provides the necessary galvanic decoupling between the electrodes. Counter-electrodes in registry with the electrodes 3 and 4 are disposed on the opposite side of the disc 11 which cannot be seen. The electrode 3 and its counter-electrode form the input pair of electrodes and are connected to terminals 5 and 6, and the electrode 4 and its counter-electrode form the output pair of electrodes and are connected to terminals 7 and 8. The terminals 5 and 6 are connected to the drive circuit 9 while the terminals 7 and 8 are connected to a controlled device 10' which in the embodiment shown in FIG. 2 is a thyrister.

The electrodes 3 and 4 as well as all electrodes on other embodiments are preferably metallization layers applied to the surface of the lamina 1 and consist, for example, of enameled silver applied as is known to those skilled in the art.

The surface area of the disc 11 available for the electrodes 3 and 4, and the corresponding counter-electrodes on the opposite side, is selected such that a piezo-electric effect results which is of substantially equal magnitude for each of the overall areas covered by the electrodes 3 and 4. The large mechanical alternating stress of the oscillatory motion existing in the central area of the disc 11 is taken into consideration in selecting the size of the area of the electrode 3. The mechanical alternating stress of smaller size decreasing to zero at the edge of the disc is considered for determining the area of the electrode 4. As discussed above, the terminals 5, 6, 7 and 8 are applied in such a manner that the above determinations can be made on the basis of an essentially freely oscillating disc.

As shown in FIG. 2, the circular nature of the electrodes 3 and 4 can be employed even if the coupler 1̄ is not in the shape of a disc. Concentric electrodes 3 and 4 can be employed with a square lamina as indicated in dashed lines in which case the electrode 4 will fill out the corners of the coupler 1̄. In this embodiment, in order to preserve the piezo-electric equilibrium between the areas covered by the electrodes 3 and 4, the diameter of the electrode 3 and the inner diameter of the electrode 4 can be selected to be correspondingly larger than in the embodiment employing the disc 11.

As shown in the dot and dashed lines in FIG. 2, a regular hexagon shape can be employed for the coupler 1̄ with the concentric configuration of the electrodes 3 and 4. Again, the electrode 4 is expanded slightly to fill out the corners of the hexagon coupler and the diameter of the electrode 3 and the inner diameter of the electrode 4 are correspondingly enlarged to compensate for the slight change in area of the electrodes.

All of the shapes of the coupler 1̄ represented in FIG. 2 can be completely described by means of a single length dimension such as, for example, a disc 11 with a diameter a, a square with a side a, or a hexagon with a side a'. The oscillatory motion of the fundamental mode is indicated in FIG. 2 by the arrows. This mode of vibration applies independently of whether the exterior of the coupler 1̄ is a circle, square, hexagon, or some other regular polygon.

Figure 3:
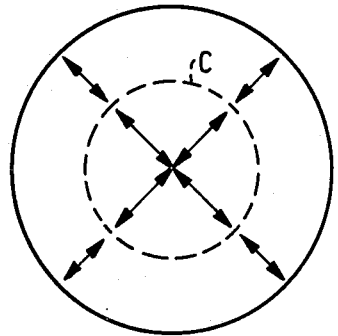
FIG. 3 is a schematic representation of the harmonic mode of vibration of a disc embodiment of the inventive piezo-ignition coupler.

The oscillation distribution for the lamina shapes shown in FIG. 2 is indicated by the double arrows shown in FIG. 3 for the first harmonic mode indicated by the nodal line c. In the case of a disc coupler the nodal line c will be a circle and will be slightly deformed in the case of lamina having various polygon shapes. In the extreme case wherein the coupler 1̄ is a square, the nodal line c will have slight bulges toward the four corners of the square.

The embodiment shown in FIG. 4 has already been described in connection with FIG. 1 and is a square embodiment employing strip electrodes 13 and 14 instead of concentric electrodes as in the square embodiment shown in FIG. 2. The terminals 5, 6, 7 and 8 are secured at the edge of the lamina 1 connected to the respective electrodes.

Figure 5:
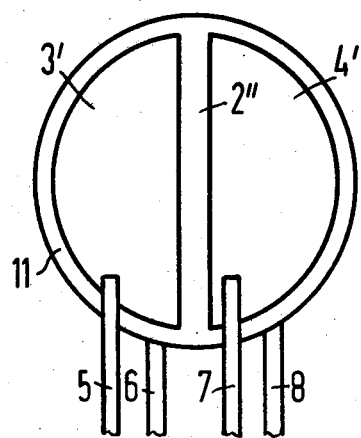

A further embodiment employing a disc lamina 11 is shown in FIG. 5 wherein the electrodes 3' and 4' are in the shape of semicircles and are separated by a gap 2'' for galvanically decoupling the electrodes. Counter-electrodes (not shown) are disposed on the opposite side of the disc 11 in registry with the electrodes 3' and 4'. The electrodes are respectively connected to terminals 5, 6, 7 and 8, and are in mirror-symmetric relation.

Figure 6:
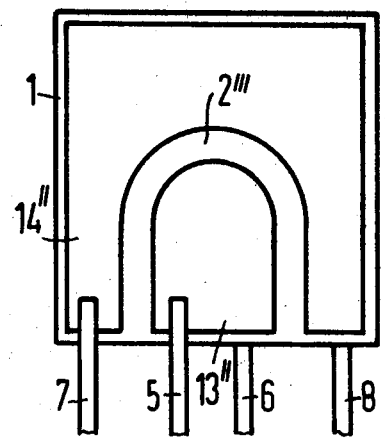

A further square embodiment is shown in FIG. 6 wherein the lamina 1 has a generally square electrode 14'' having an arch-shaped indentation at one side thereof in which is disposed a correspondingly shaped electrode 13''. The electrodes 13'' and 14'' are separated by a galvanically decoupling gap 2''' and corresponding counter-electrodes (not shown) are disposed in registry therewith on the opposite side of the lamina 1. Again, each electrode has a terminal respectively designated at 5, 6, 7 and 8. Other asymmetrically engaging electrode configurations may be employed.

Figure 7:
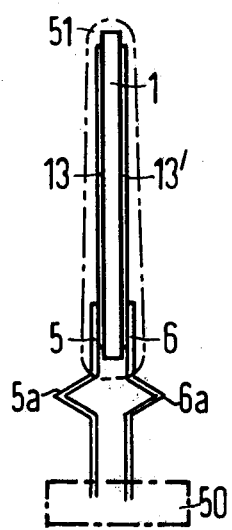
FIGS. 7 and 8 are two embodiments for the supporting terminals for the piezo-ignition coupler of the present invention.
Figure 8:
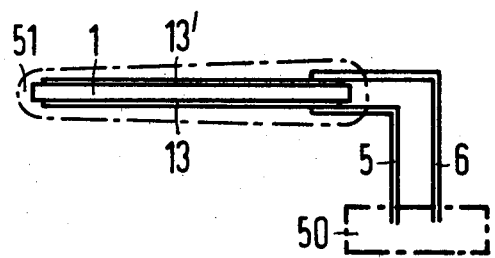

As stated above, the terminal leads 5, 6, 7 and 8 are attached at one edge of either the square lamina 1 or the disc lamina 11. As also stated, the leads are attached in a manner so as to essentially exert no influence on the oscillation of the coupler. This is achieved by the use of terminals 5 through 8 which are constructed as shown in FIGS. 7 and 8. In those figures, only terminals 5 and 6 can be seen, however, it will be understood that terminals 7 and 8 are similarly constructed. As shown in FIG. 7, the terminals 5 and 6 have angled bends 5a and 6a and are inserted into a supporting frame or circuit board 50. In the embodiment of FIG. 8, longer leads can be employed which are bent at right angles before insertion into the circuit board 50.

As also shown in FIGS. 7 and 8, the lamina is enclosed in a cladding 51 consisting preferably of a synthetic resin lacquer. The cladding 51 surrounds the entire lamina 1, or the disc lamina 11, independently of the specific shape thereof. Portions of the terminal leads 5 through 8 are likewise enclosed within the cladding 51. A sufficient mechanical connection of the individual terminal leads 5 through 8 to the respective electrodes can be achieved by the use of the cladding 51 so that other means of attachments such as, for example, soldering the leads to the electrode can be eliminated.

A particularly suitable material for the cladding 51 is a glass fiber polyester wool known as prepreg. The prepreg is thermally cured after put in place and matched to the shape of the particular lamina. As a result of the matching of the glass fiber wool projecting slightly beyond the edge of the lamina on the opposite sides, a tight mutually joined edge connection of the prepreg on the opposite sides results and further permits extension of the leads 5 through 8 through the edge while retaining a seal around those terminals. If a synthetic resin is employed as the cladding 51, the resin may be applied by the known means of eddy sintering.

Other materials may be suitable for the cladding 51 which have a modulus of electricity which is between 5 and 30 times smaller than the modulus of elasticity of the lamina 1 or the disc 11. Adherence to this criteria insures that the ability of the lamina to vibrate is not inhibited by the cladding 51. Selection of a cladding material using this criteria further insures that the cladding 51 also functions as a mechanical stabilizing means for the lamina which is necessarily thin and has a maximum thickness of 0.3 mm. For this purpose, it is preferable if synthetic resin lacquer is employed as the cladding to apply the lacquer to the surfaces of the lamina so as to harden to a cladding 51 having a thickness in the range of 30 through 100 micrometers. If glass fiber wool is employed as the cladding 51, good results are achieved when the thickness of the wool is in the range of 50 through 100 micrometers. The cladding 51 has a Q greater than 10.

The operation of the drive circuit 9 for the coupler 1̄ shown in FIG. 1 is as follows. A control pulse generated by suitable circuitry known to those skilled in the art and not illustrated in FIG. 1 is applied to the input 91. An RC arrangement consisting of a capacitor 92 and a variable resistor 92' serves for determining the oscillator frequency which is set to the desired operating resonant frequency of the coupler 1̄. A Schmitt trigger NAND element is interconnected between the input 91, the RC arrangement, and one of two driver stages 94. A clocked alternating current pulse is thus generated at the output of the drive circuit 9. The drive circuit 9 is galvanically separated from the controlled device such as the triac 10 by the dimensioning of the electrodes such as 13 and 14, and 13' and 14', on the lamina 1. The signal from the drive circuit 9 is thus transmitted through the coupler 1 to the triac 10 so that reliable and rapid ignition of whatever controlled device is employed is guaranteed.

Figure 9:
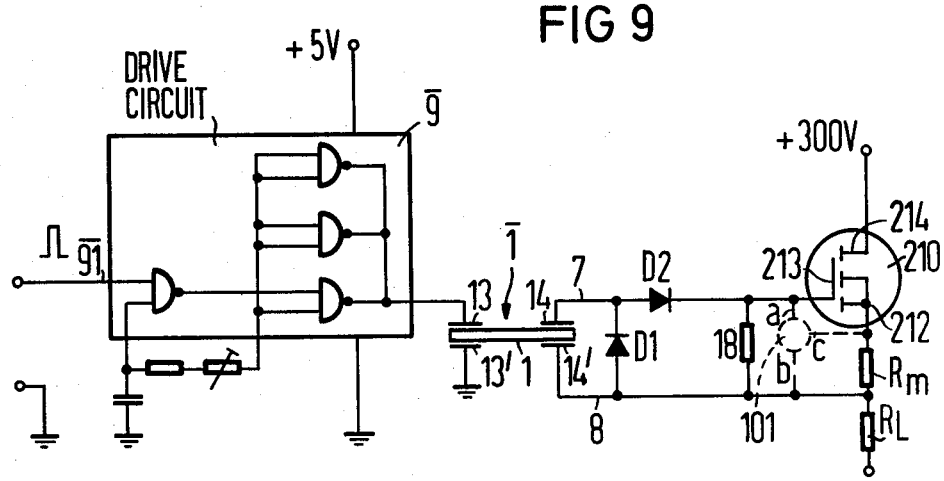
FIG. 9 is a circuit diagram for utilization of the piezo-ignition coupler for triggering a MOS switch.

A device constructed in accordance with the principles of the present invention for operating a MOS power switch is shown in FIG. 9. The drive circuit for that device is referenced at 9. The drive circuit 9 supplies a clocked alternating signal to the input electrode pair 13 and 13' upon the application of a pulse signal to the input 91. The signal supplied to the coupler 1 is, as described above, an alternating voltage signal with a frequency between 20 kHz and 500 kHz which frequency is determined by the dimensioning of the lamina 1 of the coupler 1. The frequency of the alternating voltage and the resonant frequency of the lamina 1 for excitation thereof coincide.

The drive circuit 9 is commercially available from a variety of manufacturers as an integrated circuit employing TTL technology and designated with the number 74132. The basic components thereof are shown in FIG. 9 and the operation thereof is well known to those skilled in the art and need not be further described.

As further shown in FIG. 9, the output pair of electrodes 14 and 14' are connected via the terminals 7 and 8 to a rectifier circuit including diodes D1 and D2 of the type available under the designation BAY61. A bleeder resistor having a high impedance is also connected across the terminals 7 and 8 and is referenced at 18. The MOS power switch to be controlled is referenced at 210 and may be of the type designated as BUZ45. The switch 210 has a source terminal 212, a gate terminal 213 and a drain terminal 214 and is connected to a load resistor $R_L$. The switch 210 may be employed, for example, for switching a high potential such as 300 volts. The switch 210 operates to connect the "hot" side of the load resistor $R_L$ to the potential when the source-to-drain connection is short-circuited, that is, when the channel segment of the field effect transistor forming the switch 210 is open.

The inventive coupler enables a particularly reliable switching or triggering of the switch 210 because the electric potential generated at the output side of the coupler 1 is free of reference potential and is sufficiently large so as to guarantee that the voltage across the terminals 213 and 212 will be sufficient for opening the field effect transistor forming the switch 210. The terminal 8 is accordingly connected to the source terminal 212 of the switch 210 and the drain terminal 214 of the switch 210 is connected to a positive operating potential when, as shown in FIG. 9, the switch 210 is an n-channel field effect transistor of the enhancement type.

The circuit of FIG. 9 can be modified for current limitation by the use of an electronic component 101 shown in dashed lines having terminals a, b and c and an additional resistor $R_m$ connected between the terminal c and the load resistor $R_L$. The component 101 may be, for example, a bipolar transistor wherein terminal a is the emitter, terminal b is the collector, and terminal c is the base. If $R_m$ is dimensioned such that the product of the maximum admissible current for the MOS power switch 210 and $R_m$ is greater than or equal to 0.5 volts, as a result of the fact that the element 101 becomes conductive at 0.5 volts, the input of the power switch 210 is short-circuited and the current flowing through the switch 210 is thus blocked to an increasing degree.

The component 101 may also be a thyristor wherein the terminals a and b are respectively the anode and cathode and the terminal c is the trigger electrodes. In this case, $R_m$ is dimensioned such that the product of the maximum current and $R_m$ is greater than or equal to 1 volt so that the thyrister 101 is triggered and instantaneously shuts off the current previously flowing through the power switch 210 and the load resistor $R_L$.

Figure 10:
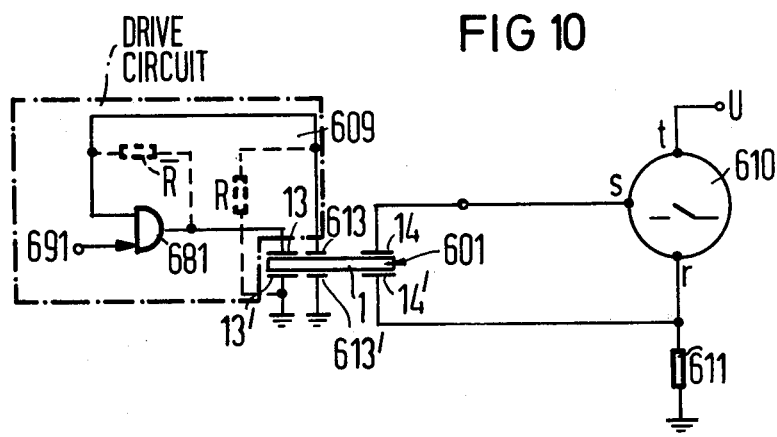
FIG. 10 is a circuit diagram for driving the piezo-ignition coupler of the present invention with feedback.

A device constructed in accordance with the principles of the present invention for operating a piezo-electric coupler 601 with feedback is shown in FIG. 10. The circuit has control electronics 609, a piezo-coupler 601 specifically designed for operation with feedback, and a power switch 610 to be controlled and a load resistor 611.

As in the preceding examples, the piezo-coupler 601 has a lamina body 1 consisting of piezo-electric material, preferably piezo-ceramic such as lead zirconate titanate or the like. The coupler 601 has input electrodes 13 and 13' and output electrodes 14 and 14'. The output electrode 14 is connected to the control electrode s of the electronic switch 10. An output signal from the output electrodes 14 and 14' switches the switch 610 between the terminals t and r independently of the grounded potential so as to connect and disconnect the load resistor 611 to the potential U.

As described above, an adapted input signal at the pair of input electrodes 13 and 13' of the coupler 610 is required for generating a suitable output signal at the output electrodes 14 and 14'. This is again an alternating current input signal having a frequency which is equal to the resonant frequency of the lamina 1 of the coupler 610. The frequency of the lamina 1 is again determined by the surface area and the principle of radial oscillation of the lamina. As also described above, while the coupler 610 operates by "radial oscillation", this does not require a disc lamina, rather a lamina of any shape as described above can be employed.

The input signal to the electrodes 13 and 13' is supplied by an amplifier 681 having an input 691. The amplifier 681 may, for example, be a CMOS inverter CED 4011. Such a commercially available inverter consists of four integrated inverters which are connected in parallel. The gain of the inverter 681 is variable at the control input between two possible states exhibiting respective phase rotations of 0° and 180°.

The coupler 601 differs from previously-discussed couplers constructed in accordance with the principles of the present invention by the addition of feedback electrodes 613 and 613'. An alternating current signal is supplied to the feedback electrode pair, the signal having its origin in a mechanical vibration of the lamina 1 of the coupler 601. The mechanical vibration is produced by applying the alternating current signal to the pair of input electrodes 13 and 13'. According to the well known operation of a feedback circuit, such a feedback vibration situation arises when a sufficient amplification exists in the feedback circuit as is present in the input electronic 609 with the amplifier 681. In one embodiment, a resistor R may be employed having a resistance value which is less than $1/\omega C$ where C is the capacitance of the input pair of electrodes 13 and 13' and $\omega$ is the angular velocity of the vibratory oscillation. Alternatively, a resistor $\bar{R}$ can be employed in the position shown in FIG. 10 which has a resistance value approximately equal to $v/\omega C_R$ where v is the gain of the amplifier 681 and $C_R$ is the capacitance of the feedback electrode pair 613 and 613'. The resistors R and $\bar{R}$ are alternately employed, and are not used together in the same circuit. Selection of the above resistance values for those resistors insures that the respective phase rotation necessary for feedback with employment of the coupler 601 exists in the feedback circuit of the input electronics 609, namely, for those cases in which the amplification element has no phase rotation R is used, and R̄ is used if the inverter 681 exhibits 180° phase rotation.

Top and bottom views of an embodiment of the coupler 601 are respectively shown in FIGS. 11a and 11b. The views are shown as if the lamina were split in half and the pieces rotated about a vertical axis disposed between the two Figs. The input electrodes 13 and 13' take the form of an essentially strip-shaped electrode having a bulge on one side thereof. The output electrodes 14 and 14' are also essentially strip electrodes each having an indentation in one side thereof for accommodating the bulge of the respective electrodes 13 and 13'. A galvanically decoupling gap is present between electrodes 13 and 14 and between 13' and 14'. The electrodes 13 and 13' are not precisely in registry with the electrode 13', the counter-electrode, occupying a slightly larger area than does the electrode 13. This is because a portion of the counter-electrode 13' forms the counter-electrode for the feedback electrode 613 shown in FIG. 11a. The dashed circle 622 shown in FIGS. 11a and 11b indicates the vibratory nodal line for the first harmonic of the radial oscillation of the coupler 601 which is a square having sides of length a. As can be seen, the arc-shaped feedback electrode 613 extends over the portion of the surface of the coupler 601 designated by the nodal line 622. Only a straight portion 613" of the feedback electrode 613 lies beyond the nodal line 622 for attachment to a terminal 635. It will be understood that the arc 613 may extend so as to substantially form a complete circle, however, an essentially semicircular arc is preferable for simplification in manufacturing the electrode 13. That portion of the electrode 13' lying immediately beneath the electrode 613 forms the counter electrode for the feedback electrode 613. This construction corresponds to a galvanic connection between the electrodes 613' and 13' shown in FIG. 10, however, this is a simplification which does not inhibit operation of the coupler 601 and still preserves galvanic decoupling between the electrodes 13 and 14 and the electrodes 13' and 14'.

Because considerable mechanical alternating stress of the fundamental operation exists because of the radial oscillation of the lamina of the coupler 601 in the area of the nodal line 602, a particularly strong feedback signal can be tapped between the electrode 613 and that portion of the electrode 13' which forms the counter-electrode for the feedback electrode 613. Only that surface component of the electrode 13' which is in registry with the electrode 13 functions as a counter-electrode for the input pair of electrodes. It is that surface component which forms the capacitance C.

As can also be seen in FIG. 11b, the bottom of the coupler 601 exhibits no portion of the feedback counter-electrode corresponding to the straight portion 613" shown in FIG. 11a. This eliminates any possibility of the electrode 613 contributing to the feedback signal in the area of the straight portion 613". The elimination of a counter-electrode corresponding to the straight portion 613" is that should the coupler 601 shift into a mode of vibration of the first harmonic, no residual signal will be generated between the straight portion 613" and a corresponding electrode on the opposite side. In the case of such a shift, substantially no signal whatsoever could be generated in the area of the feedback electrode 613 because that electrode is disposed substantially above the nodal line 622 for that harmonic.

Proper operation of the device is insured when the amplifier 681 has a voltage amplification greater than 1 and a current amplification which is greater than the ratio between the effective surface area of the pair of input electrodes 13 and 13' and the effective area of the feedback electrode 613. Although as described above it is normally desirable to oscillate the lamina 601 in its fundamental mode of radial oscillation, in which case the feedback electrode 613 is disposed above the nodal line for the first harmonic, the lamina 601 may be oscillated in a mode of vibration other than the fundamental mode, in which case the feedback electrode 613 is disposed on the surface of the lamina above the nodal line for the next-highest harmonic mode of vibration.

Terminals for the electrodes 13, 13', 14 and 14' are respectively referenced at 633, 633', 634 and 634' and are attached at an edge of the lamina, as is the terminal 635.

Although modifications and changes may be suggested by those skilled in the art it is the intention of the inventors to embody within the patent warranted hereon all changes and modifications as reasonably and properly come within the scope of their contribution to the art.

We claim as our invention:

1. A device for triggering an electronic switch comprising:

a piezo-ignition coupler for supplying a trigger signal to said electronic switch, said piezo-ignition coupler consisting of a lamina of piezo-ceramic material, at least two electrodes disposed on one surface of said lamina and a like number of counter-electrodes disposed on the opposite side of said lamina in at least substantial registry therewith, each of said electrodes and counter-electrodes having a terminal, said electrodes on a same surface of said lamina being spaced from other by an electrically insulating gap for galvanically decoupling said spaced electrodes, one electrode on one surface of said lamina and one counter-electrode in at least substantial registry therewith on the opposite surface of said lamina forming an input pair of electrodes, and another electrode on said one surface of said lamina and another counter-electrode in at least substantial registry therewith on the opposite surface of said lamina forming an output pair of electrodes and being connected to a trigger electrode of said electronic switch, said lamina having a shape exhibiting an axis with more than two-fold rotational symmetry with a resonant frequency of vibration determined by a single length dimension of the area of said lamina;

a cladding applied adjacent to said surfaces of said lamina and covering a portion of each of said terminals, said cladding consisting of electrically non-conductive material and having a modulus of elasticity which is less than or equal to two tenths of the modulus of elasticity of the piezo-ceramic material comprising said lamina and said cladding having a reciprocal mechanical quality factor Q which is greater than ten; and control electronics connected to said input pair of electrodes for generating an alternating current signal having a frequency which is matched to said resonant frequency of said lamina at a value in the range of 20 kHz to 500 kHz for inducing a selected radial oscillation mode in said lamina.

2. The device of claim 1 wherein said cladding consists of a synthetic resin lacquer.

3. The device of claim 1 wherein said cladding consists of a synthetic material and is applied by eddy sintering.

4. The device of claim 1 wherein said cladding is synthetic glass fiber wool.

5. The device of claim 1 wherein said terminals serve as the only mechanical supports for said coupler.

6. The device of claim 1 wherein said lamina is circular in shape.

7. The device of claim 1 wherein said lamina is square in shape.

8. The device of claim 1 wherein said electrodes on a same side of said lamina are disposed concentrically with respect to each other.

9. The device of claim 1 wherein said electrodes on a same surface of said lamina are disposed in mirror-symmetric relation with respect to each other and with respect to said electrically insulating gap.

10. The device of claim 1 wherein said electrodes on a same surface of said lamina engage asymmetrically along said electrically insulating gap.

11. The device of claim 1 wherein said terminals are respectively connected to said electrodes along one edge of said lamina.

12. The device of claim 1 wherein each of said terminals has at least one angled bend for minimizing the influence of said terminals on the oscillation of said coupler.

13. The device of claim 1 further comprising:
a feedback electrode disposed on one surface of said lamina and a feedback counter-electrode disposed on the opposite surface of said lamina in registry therewith,
said feedback electrode and said feedback counter-electrode being disposed substantially in a portion of the area of said lamina exhibiting a nodal line for the radial mode of oscillation which is next-highest above said selected radial oscillation mode; and
a feedback amplifier in said control electronics having an input connected to said feedback electrode and having an output connected to said one electrode on said one surface of said lamina for supplying an alternating signal to said pair of input electrodes which is derived from said feedback electrode and said feedback counter-electrode,
said amplifier having a voltage amplification greater than 1 and a current application greater than a ratio between an effective area of said input pair of electrodes and an effective area of said feedback electrode,
said amplifier having a separate input for controlling the gain of said amplifier, and
said control electronics including a means for generating an overall phase rotation of 90° between a signal at said input pair of electrodes and said feedback electrode.

14. The device of claim 13 wherein said feedback counter-electrode is integrated with said counter-electrode of said input pair of electrodes.

15. The device of claim 13 wherein said feedback electrode has a portion thereof extending from said area of said lamina exhibiting said nodal line to an edge of said lamina for connection to a terminal and wherein said feedback counter-electrode is disposed completely above said area of said lamina at which said nodal line exists and has no portion in registry with said portion of said feedback electrode.

16. The device of claim 13 wherein said feedback electrode is disposed on said one surface of said lamina between said one electrode of said input pair of electrodes and said another electrode of said output electrodes and is separated therefrom by an electrically insulating gap.

17. The device of claim 13 wherein said one of said input pair of electrodes on said one surface of said lamina has a substantially circular protrusion on a side thereof extending toward a center of said lamina and wherein said another electrode on said one surface of said lamina which is one of said output pair of electrodes has a corresponding recess for receiving said protrusion, and wherein said feedback electrode is in the shape of an arc concentric with said circular protrusion disposed between said protrusion and said recess.

18. The device of claim 13 wherein said amplifier has no phase rotation and wherein said means for generating a phase rotation of 90° is a resistor connected across said feedback electrode and said counter-electrode of said input pair of electrodes having a value which is less than the reciprocal of the product of the capacitance of said input pair of electrodes and the angular velocity of said resonant frequency.

19. The device of claim 13 wherein said amplifier has a phase rotation of 180° and said means for generating a phase rotation of 90° is a resistor connected across said input of said amplifier and said output of said amplifier having a value approximately equal to the gain of said amplifier divided by the product of the angular velocity of said resonant frequency and the capacitance between said feedback electrode and said feedback counter-electrode.

20. The device of claim 19 wherein said amplifier is at least one CMOS gate.

21. A device for triggering a MOS power switch comprising:
a piezo-ignition coupler for supplying a trigger signal to said power switch, said piezo-ignition coupler consisting of
a lamina of piezo-ceramic material,
at least two electrodes disposed on one surface of said lamina and a like number of counter-electrodes disposed on the opposite side of said lamina in at least substantial registry therewith,
said electrodes on a same surface of said lamina being spaced from each other by an electrically insulating gap for galvanically decoupling said spaced electrodes,
one electrode on one surface of said lamina and one counter-electrode in at least substantial registry therewith on the opposite surface of said lamina forming an input pair of electrodes, and another electrode on said one surface of said lamina and another counter-electrode in at least substantial registry therewith on the opposite surface of said lamina forming an output pair of electrodes and being connected to a trigger electrode of said power switch, said lamina having a shape exhibiting an axis with more than two-fold rotational symmetry with a resonant frequency of vibration determined by a single length dimension of the area of said lamina;

a current limiting means connected to said MOS power switch for selectively short-circuiting said power switch comprising a bipolar transistor having an emitter connected to a gate of said MOS power switch, a collector connected to said counter-electrode of said output pair of electrodes of said coupler, and a base connected to a source terminal of said MOS power switch, a resistor connected across said collector terminal and said base terminal of said bipolar transistor, said resistor having a value which is greater than a voltage at which said bipolar transistor becomes conductive across said emitter and base terminals divided by a maximum admissible current to said MOS power switch; and control electronics connected to said input pair of electrodes for generating an alternating current signal having a frequency which is matched to said resonant frequency of said lamina at a value in the range of 20 kHz to 500 kHz for inducing a selected radial oscillation mode in said lamina.

22. A device for triggering a MOS power switch comprising:

a piezo-ignition coupler for supplying a trigger signal to said power switch, said piezo-ignition coupler consisting of a lamina of piezo-ceramic material, at least two electrodes disposed on one surface of said lamina and a like number of counter-electrodes disposed on the opposite side of said lamina in at least substantial registry therewith, said electrodes on a same surface of said lamina being spaced from each other by an electrically insulating gap for galvanically decoupling said spaced electrodes, one electrode on one surface of said lamina and one counter-electrode in at least substantial registry therewith on the opposite surface of said lamina forming an input pair of electrodes, and another electrode on said one surface of said lamina and another counter-electrode in at least substantial registry therewith on the opposite surface of said lamina forming an output pair of electrodes and being connected to a trigger electrode of said power switch, said lamina having a shape exhibiting an axis with more than two-fold rotational symmetry with a resonant frequency of vibration determined by a single length dimension of the area of said lamina;

a current limiting means connected to said MOS power switch for selectively short-circuiting said power switch comprising a thyrister having an anode connected to a gate terminal of said MOS power switch, a cathode connected to said counter-electrode of said output pair of electrodes of said coupler and a trigger electrode connected to a source terminal of said MOS power switch, a resistor connected across said trigger terminal and said cathode, said resistor having a value such that the product of said value and a maximum admissible current to said MOS power switch is greater than or equal to one volt; and control electronics connected to said input pair of electrodes for generating an alternating current signal having a frequency which is matched to said resonant frequency of said lamina at a value in the range of 20 kHz to 500 kHz for inducing a selected radial oscillation mode in said lamina.

* * * * *